United States Patent
Tanaka et al.

(10) Patent No.: US 6,861,013 B2
(45) Date of Patent: Mar. 1, 2005

(54) DIE-ATTACHING PASTE AND SEMICONDUCTOR DEVICE

(75) Inventors: Nobuki Tanaka, Tokyo (JP); Hikaru Okubo, Tokyo (JP); Ryuichi Murayama, Tokyo (JP); Kazuto Onami, Tokyo (JP); Tomohiro Kagimoto, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 331 days.

(21) Appl. No.: 10/239,721

(22) PCT Filed: Apr. 9, 2001

(86) PCT No.: PCT/JP01/03040

§ 371 (c)(1),
(2), (4) Date: Sep. 25, 2002

(87) PCT Pub. No.: WO01/77243

PCT Pub. Date: Oct. 18, 2001

(65) Prior Publication Data

US 2003/0146521 A1 Aug. 7, 2003

(30) Foreign Application Priority Data

| Apr. 10, 2000 | (JP) | 2000-107637 |
| Aug. 20, 2000 | (JP) | 2000-257734 |
| Sep. 18, 2000 | (JP) | 2000-281109 |
| Sep. 28, 2000 | (JP) | 2000-296899 |
| Oct. 5, 2000 | (JP) | 2000-306227 |

(51) Int. Cl.$^7$ .......... H01L 23/48; C08L 63/00
(52) U.S. Cl. .......... 252/511; 252/503; 252/510; 252/518.1; 257/783
(58) Field of Search .......... 252/500, 511, 252/510, 518.1; 257/782, 783

(56) References Cited

FOREIGN PATENT DOCUMENTS

| JP | 11-228928 | * | 2/1998 | C09J/47/00 |
| JP | 11228928 | | 8/1999 | |
| JP | 11-269452 | * | 10/1999 | C09J/1/00 |
| JP | 2000-104035 | * | 4/2000 | C08J/163/08 |
| JP | 2000-234043 | * | 8/2000 | C08L/33/08 |
| JP | 2001-207033 | * | 7/2001 | C08L/63/00 |

OTHER PUBLICATIONS

International Search Report, dated Jul. 24, 2001, for PCT Application No. PCT/JP01/03040, 4 pps.

* cited by examiner

Primary Examiner—Mark Kopec
Assistant Examiner—Kallambella Vijayakumar
(74) Attorney, Agent, or Firm—Smith, Gambrell & Russell, LLP

(57) ABSTRACT

The present invention provides a die-attaching paste superior in solder cracking resistance, used for bonding of semiconductor chips. The present invention lies in a die-attaching paste comprising as essential components:

(A) a hydrocarbon having a number-average molecular weight of 500 to 5,000 and at least one double bond in the molecule, or its derivative,
(B) a reactive diluent,
(C) a radical polymerization catalyst, and
(D) a filler.

9 Claims, No Drawings

DIE-ATTACHING PASTE AND SEMICONDUCTOR DEVICE

TECHNICAL FIELD

The present invention relates to a die-attaching paste superior in solder cracking resistance, used for bonding of semiconductor chips, as well as to a semiconductor device superior in reliability, produced by using such a die-attaching paste.

BACKGROUND ART

In recent years, the production amount of semiconductor devices has shown a steady increase, and a reduction in production cost thereof has become an important task. For bonding of semiconductor chips to a lead frame, there is a method of using, as an adhesive, an inorganic material such as gold-silicon eutectic material or the like. This method is expensive and may incur breakage of semiconductor chips caused by thermal stress; therefore, a method of using a die-attaching paste (a paste-like adhesive) obtained by dispersing a filler in an organic material or the like, has become a main stream.

Meanwhile, with respect to the reliability of semiconductor devices, solder cracking resistance is particularly important. A die-attaching paste capable of giving a semiconductor device having satisfactory solder cracking resistance needs to have a low modulus of elasticity for relaxation of the difference in linear expansion coefficient between semiconductor chips and lead frame.

In recent years, the requirement for solder cracking resistance has become strict; as solder has become lead-free, the reflow soldering conditions have been switched from 240° C. to 260° C.; in order to meet this temperature increase of 20° C., a lower elastic modulus has become necessary. For a lower elastic modulus, die-attaching pastes using a low-stress substance (e.g. a rubber) have heretofore been known; however, they are unable to satisfy the recent requirement for solder cracking resistance and an improved die-attaching paste is needed.

DISCLOSURE OF THE INVENTION

The present invention aims at providing a die-attaching paste superior in solder cracking resistance, used for bonding of semiconductor chips, and a semiconductor device superior in reliability, produced by using such a die-attaching paste.

According to the present invention, there is provided a die-attaching paste comprising as essential components:
(A) a hydrocarbon having a number-average molecular weight of 500 to 5,000 and at least one double bond in the molecule, or its derivative,
(B) a reactive diluent,
(C) a radical polymerization catalyst, and
(D) a filler.

In preferred embodiments, the component (A), i.e. the hydrocarbon having a number-average molecular weight of 500 to 5,000 and at least one double bond in the molecule, or its derivative is a combination of a compound obtained by a reaction between a maleinized polybutadiene and a (meth) acrylic acid/aliphatic dialcohol ester, and an epoxidized polybutadiene, or is a polybutadiene having acrylic or methacrylic group at the two terminals, or is a combination of an acrylic or methacrylic group-containing polybutadiene which is liquid at room temperature and an epoxidized polybutadiene; the reactive diluent (B) is selected from a compound having at least one acrylic or methacrylic group in the molecule, a (meth)acrylic monomer having at least one fluorine atom in the molecule and diallyl phthalate; a part of the filler (D) is at least one metal element selected from iron, cobalt, nickel, copper and zinc; the die-attaching paste further comprises (E) a silane coupling agent represented by the following general formula (1):

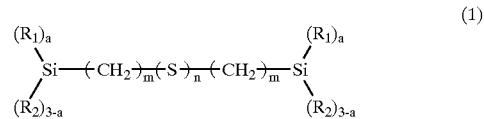

wherein $R_1$ is an alkoxy group having 1 to 10 carbon atoms, $R_2$ is an alkyl group having 1 to 10 carbon atoms, a is an integer of 1 to 3, m is an integer of 1 to 5, and n is an integer of 1 to 10; the die-attaching paste further comprises a hydrogenated polybutadiene having a number-average molecular weight of 500 to 4,000; the die-attaching paste further comprises (G) a curing accelerator which is a compound having at least one primary amino group in the molecule and a melting point of 100 to 230° C.

According to the present invention, there is also provided a semiconductor device produced by using the above preferred die-attaching paste.

DETAILED DESCRIPTION OF THE INVENTION

According to the finding by the present inventors, a hydrocarbon having a number-average molecular weight of 500 to 5,000 and at least one double bond in the molecule or its derivative, i.e. the component (A) of the die-attaching paste of the present invention can give a die-attaching paste which, when cured, becomes a cured material having flexibility and showing good adhesivity over a wide temperature range. In the case of, for example, a cured material of high crosslink density and no flexibility, a high cohesive force can be obtained but it is difficult to obtain a high adhesive force at the interface with a lead frame or with a die. When the number-average molecular weight of the component (A) is less than 500, it is difficult to allow the resulting die-attaching paste to give a cured material having sufficient distances between the crosslink sites and no sufficient adhesivity is obtained. Meanwhile, when the number-average molecular weight is more than 5,000, the component (A) has a high viscosity and it is impossible to use the component (A) in an amount necessary to obtain a sufficient adhesivity. Therefore, such number-average molecular weights of the component (A) are not preferred.

The component (A) used in the present invention includes, for example, diene type rubbers such as butyl rubber, isoprene rubber, liquid polybutadiene and the like; and derivatives thereof. The derivatives include acrylic-modified polybutadiene, epoxy-modified polybutadiene, etc. These rubbers and derivatives can be used singly or in admixture.

Preferred as the component (A) is a combination of a compound obtained by a reaction between a maleinized polybutadiene and a (meth)acrylic acid/aliphatic dialcohol ester, and an epoxidized polybutadiene; a polybutadiene having acrylic or methacrylic group at the two terminals; or a combination of an acrylic or methacrylic group-containing polybutadiene which is liquid at room temperature and an epoxidized polybutadiene.

The number-average molecular weight of the component (A), referred to in the present invention is a polystyrene-reduced value of a value obtained by gel permeation chromatography.

In the present invention, the reactive diluent (B) is used for the viscosity adjustment, improved workability, and improved curability of a die-attaching paste, because use of the component (A) alone and no use of the component (B) gives a die-attaching paste of high viscosity and low workability. Preferred as the component (B) are compounds having at least one acrylic or methacrylic group in the molecule, such as alicyclic (meth)acrylic acid ester, aliphatic (meth)acrylic acid ester, aromatic (meth)acrylic acid ester and the like. Specific examples are 1,6-hexanediol dimethacrylate, 1,9-nonanediol dimethacrylate, phenoxydiethylene glycol acrylate, lauryl acrylate, stearyl acrylate and phenoxyethyl methacrylate; however, the component (B) is not restricted thereto. There are also preferably used (meth) acrylic monomers having at least one fluorine atom in the molecule and diallyl phthalate. These compounds can be used singly or in admixture.

The amount of the component (A) used in the present invention is preferably 10 to 90% by weight in the total amount of the component (A) and the component (B). When the amount of the component (A) is less than 10% by weight, the resulting die-attaching paste has low adhesivity. When the amount is more than 90% by weight, the resulting die-attaching paste has a high viscosity and has a problem in workability. Therefore, such amounts are not preferred.

The radical polymerization catalyst (C) used in the present invention is not critical as long as it is a catalyst ordinarily used in radical polymerization. However, it is preferably a radical polymerization catalyst which shows a decomposition temperature of 40 to 140° C. when subjected to a rapid heating test of placing 1 g of a sample on an electrical heating plate and elevating the temperature of the sample at 4° C./min to, measure the decomposition-starting temperature. When the decomposition temperature is less than 40° C., the resulting die-attaching paste has inferior storability at room temperature. When the decomposition temperature is more than 140° C., the resulting die-attaching paste requires an extremely long curing time.

As specific examples of the catalyst satisfying the above decomposition temperature, there can be mentioned 1,1-bis (tert-butylperoxy)-2-methylcylochexane, tert-butyl peroxyneodecanoate and dicumyl peroxide. These compounds can be used singly, or in admixture of two or more kinds for controlled curability. It is possible to further add a polymerization inhibitor for improved storability of a die-attaching paste.

The amount of the radical polymerization catalyst (C) used is preferably 0.1 to 10 parts by weight per 100 parts by weight of the total of the component (A) and the component (B). When the amount is more than 10 parts by weight, the resulting die-attaching paste shows a large viscosity change with the lapse of time and has a problem in workability. When the amount is less than 0.1 part by weight, the resulting die-attaching paste has significantly reduced curability. Therefore, such amounts are not preferred.

It is preferred to use, in the present die-attaching paste, a silane coupling agent (E) represented by the general formula (1) because the resulting die-attaching paste can show remarkably improved adhesivity. In the general formula (1), $R_1$ is an alkoxy group having 1 to 10 carbon atoms; $R_2$ is an alkyl group having 1 to 10 carbon atoms; a is an integer of 1 to 3 which determines the number of carbon atoms of the alkoxy group(s), and can control the reactivity between silane coupling agent and resin or filler; m is an integer of 1 to 5, with 3 being preferred for availability of such a silane coupling agent; and n is an integer of 1 to 10, with 2 or 4 being preferred for availability of such a silane coupling agent. Specific examples of the silane coupling agent (E) are shown below; however, the silane coupling agent (E) is not restricted thereto.

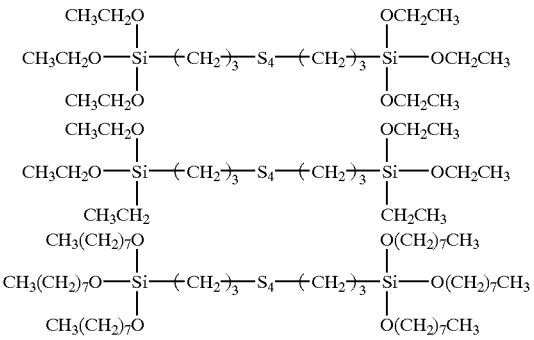

The amount of the component (E) used is preferably 0.01 to 10 parts by weight per 100 parts by weight of the total of the component (A) and the component (B). When the amount is less than 0.01 part by weight, no sufficient improvement in adhesivity is obtained. An amount of more than 10 parts by weight results in reduced curing rate. Therefore, such amounts are not preferred.

As the filler (D) used in the present invention, there can be mentioned, for example, electrically conductive fillers such as silver powder, gold powder, nickel powder, copper powder and the like; and insulating fillers such as aluminum nitride, calcium carbonate, silica, alumina and the like. A preferred conductive filler is silver powder and a preferred insulating filler is silica.

The amount of the filler used is not critical but is preferably 20 to 95% by weight of the total die-attaching paste. When the amount is less than 20% by weight, the adhesion strength obtained tends to be low. When the amount is more than 95% by weight, the resulting die-attaching paste has a high viscosity and tends to show low workability. Therefore, such amounts are not preferred.

The silver powder is used for imparting electrical conductivity and contains ionic impurities (e.g. halogen ions and alkali metal ions) in an amount of preferably not more than 10 ppm. The silver powder is used in the form of flake, tree branch, sphere or the like. The particle diameter of the silver powder differs depending upon the required viscosity of the die-attaching paste to be obtained; however, a preferred average particle diameter is generally 2 to 10 μm and a preferred maximum particle diameter is generally 50 μm or less. When the average particle diameter is less then 2 μm, the resulting die-attaching paste has a high viscosity. When the average particle diameter is more than 10 μm, the resulting die-attaching paste gives rise to resin bleeding during coating or curing. Therefore, such average particle diameters are not preferred. When the maximum particle diameter is more than 50 μm, plugging of a needle takes place when the resulting die-attaching paste is coated using a dispenser; therefore, such a maximum particle diameter is not preferred. It is possible to use a mixture of a relatively coarse silver powder and a fine silver powder. It is also possible to use a mixture of silver powders of different forms.

The silica as an insulating filler preferably has a average particle diameter of 1 to 20 μm and the maximum particle diameter of 50 μm or less. When the average particle diameter is less than 1 μm, the resulting die-attaching paste has a high viscosity. When the average particle diameter is more than 20 μm, the resulting die-attaching paste gives rise to resin bleeding during coating or curing. Therefore, such average particle diameters are not preferred. When the maximum particle diameter is more than 50 μm, plugging of a needle takes place when the resulting die-attaching paste is coated using a dispenser; therefore, such a maximum particle diameter is not preferred. It is possible to use a mixture of relatively coarse silica and fine silica. It is also possible to use a mixture of silicas of different forms.

Preferably, there is contained, as a part of the filler, at least one kind of metal element selected from iron, cobalt, nickel, copper and zinc, in an amount of 0.01 to 10% by weight based on the die-attaching paste. This is because metal elements such as iron, cobalt, nickel, copper, zinc and the like promote the resin reaction of the present die-attaching paste and can allow the paste to have good curability. When the amount of the metal element used is less than 0.01% by weight, no intended effect of curing promotion is obtained. When the amount is more than 10% by weight, the resulting die-attaching paste shows too large a change at room temperature with the lapse of time. Therefore, such amounts are not preferred. The above metal elements may be used as individual particles or in the form of an alloy.

To the die-attaching paste of the present invention can be added, as necessary, additives such as other coupling agent, antifoaming agent, surfactant, elastomer, curing accelerator and the like.

As the elastomer, there can preferably be used a hydrogenated polybutadiene having a number-average molecular weight of 500 to 4,000. Addition of this elastomer was found to incur a significant reduction in elastic modulus. When the number-average molecular weight of the elastomer is less than 500, no sufficient reduction in elastic modulus is obtained. When the number-average molecular weight is more than 4,000, the resulting die-attaching paste may have increased viscosity and reduced adhesivity. Therefore, such number-average molecular weights are not preferred.

Specific examples of the elastomer are a hydrogenated polybutadiene (BI-2000, a product of Nippon Soda Co., Ltd.) and acrylic-modified hydrogenated polybutadiene (TEAI-1000, a product of Nippon Soda Co., Ltd.).

The amount of the hydrogenated polybutadiene used is preferably 1 to 20 parts by weight per 100 parts by weight of the total of the component (A) and the component (B). When the amount is less than 1 part by weight, no sufficient reduction in elastic modulus is obtained. An amount of more than 20 parts by weight results in reduced workability and curability. Therefore, such amounts are not preferred.

Preferred as the curing accelerator (G) is a compound having at least one primary amino group in the molecule and a melting point of 100 to 230° C.. Addition of this compound accelerates the curing reaction of the present die-attaching paste because the amino group accelerates the decomposition reaction of a radical initiator. Further, the addition increases the cohesive force of the cured material of the present die-attaching paste when the carbonyl group is present in the paste, because the amino group reacts with the carbonyl group.

A melting point of lower than 100° C. is not preferred because the above reaction proceeds during the production or storage of the present die-attaching paste and a viscosity increase is incurred. A melting point of higher than 230° C. is not preferred, either, because the curing accelerator (G) remains as a solid at a high probability even during the curing of the present die-attaching paste and no intended effect is obtained. As specific examples of the curing accelerator (G), there can be mentioned dicyandiamide, isophthalic acid dihydrazide, adipic acid dihydrazide, sebacic acid dihydrazide, carbon dihydrazide and dodecanedioic acid dihydrazide. These compounds can be used singly or in combination of two or more kinds.

The amount of the curing accelerator used is 0.3 to 10 parts by weight per 100 parts by weight of the total of the component (A) and the component (B). When the amount is less than 0.3 part by weight, the intended effect cannot be obtained sufficiently. When the amount is more than 10 parts by weight, the resulting die-attaching paste contains a solid content in too large an amount, and reduced workability is incurred. Therefore, such amounts are not preferred.

The die-attaching paste of the present invention is produced, for example, by premixing individual materials, kneading the premix using a three-roll mill or the like, and subjecting the kneaded material to degassing under vacuum.

In order to produce a semiconductor device using the present die-attaching paste, a known method can be used.

BEST MODE FOR CARRYING OUT THE INVENTION

The present invention is specifically illustrated below by way of Examples and Comparative Examples.

EXAMPLES 1–15 AND COMPARATIVE EXAMPLES 1–3

In Examples the following components were mixed in the proportions shown in Table 1; each of the resulting mixtures was kneaded using a three-roll mill; and each kneaded material was degassed to obtain various die-attaching pastes. The performances of each die-attaching paste were evaluated according to the following methods. The results of the evaluation are shown in Table 1.

Component (A)
Acrylic-modified polybutadiene (number-average molecular weight: about 1,000, MM-1000-80, a product of Nippon Petrochemical Co., Ltd.), Epoxy-modified polybutadiene (number-average molecular weight: about 1,000, E-1000-8, a product of Nippon Petrochemical Co., Ltd.), Polybutadiene having (meth)acrylic group at the two terminals (number-average molecular weight: about 3,000, BAC-45, a product of Osaka Organic Chemical Ind. Ltd.)

Component (B)
Lauryl acrylate (NK Ester LA, a product of Shin-Nakamura Chemical Co., Ltd.), Trifluoroethyl methacrylate (Light Ester M-3F, a product of Kyoeisha Chemical Co., Ltd.), Diallyl o-phthalate (Daiso Dap Monomer, a product of Daiso Co., Ltd.), Component (C)
Dicumyl peroxide (decomposition temperature in rapid heating test: 126° C., Percumyl D, a product of Nippon Oils and Fats Co., Ltd.)

Component (E)
Bis(3-triethoxysilylpropyl)tetrasulfane (A-1289, a product of Nippon Unicar Company Limited)

Filler (D)
Flaky silver powder (average particle diameter: 3 μm, maximum particle diameter: 20 μm), Crushed silica (average particle diameter: 3 μm, maximum particle diameter: 16 μm), Copper powder (average particle diameter: 1 μm)

Elastomer
Hydrogenated polybutadiene (BI-2000, a product of Nippon Soda Co., Ltd.)

Curing Accelerator (G)
Dicyandiamide (reagent, melting point: 209.5° C.)
Coupling Agent
Alkoxysilane (KBM-403E, a product of Shin-Etsu Chemical Co., Ltd.)

In Comparative Examples, a part of the components used in Examples, or that plus the following materials were used as compounding materials. Compounding was made in the proportions shown in Table 2, and then kneading and degassing were carried out in the same manner as in Examples, to obtain die-attaching pastes. The performances of each die-attaching paste were evaluated according to the following methods and the results are shown in Table 2.

Diglycidyl bisphenol A type epoxy resin obtained by reaction of bisphenol A and epichlorohydrin (epoxy equivalent: 180, liquid at room temperature, hereinafter abbreviated to bis A epoxy), Cresyl glycidyl ether (epoxy equivalent: 185, hereinafter abbreviated to CGE), Phenolic novolac resin (hydroxyl equivalent: 104, softening point: 85° C., hereinafter abbreviated to PN), 2-Phenyl-4,5-dihydroxymethylimidazole (Curezole 2 PHZ, a product of Shikoku Chemicals Corporation)

Evaluation of Performances (1) Viscosity

Measured at 2.5 rpm at 25° C. using an E type viscometer (3° cone).

(2) Elastic Modulus

A test piece of 10×150×0.1 mm was produced (curing conditions: 175° C. and 30 minutes). The test piece was subjected to a tensile test to measure a load-displacement curve (test length: 100 mm, test speed: 1 mm/min, test temperature: 25° C.), and an elastic modulus was determined from the initial gradient of the curve.

(3) Adhesion Strength

A 6×6 mm silicon chip was mounted on a copper frame using an obtained paste. The resulting material was placed on a hot plate of 200° C. for 30 seconds and 60 seconds to give rise to curing of the paste. Then, hot die shear strength at 260° C. was measured using an automatic adhesion strength tester.

(4) Solder Cracking Resistance

A copper lead frame and a silicon chip (6×6 mm) were bonded using an obtained die-attaching paste, and curing of the paste was made on a hot plate at 200° C. for 60 seconds. Then, the resulting package was encapsulated with an encapsulating material (Sumikon EME-7026, a product of Sumitomo Bakelite Company Limited) to produce an encapsulated package (QFP, 14×20×2.0 mm). The encapsulated package was subjected to a moisture absorption treatment for 192 hours in an atmosphere of 60° C. and 60% relative humidity and then to an IR reflow treatment (260° C., 10 seconds, three times of reflow), after which the number of samples having internal cracks was examined by sectional observation and was used as a yardstick of solder cracking resistance. The total number of the samples used for testing was 8.

TABLE 1

| | Examples | | | | | | | |
|---|---|---|---|---|---|---|---|---|
| | 1 | 2 | 3 | 4 | 5 | 6 | 7 | 8 |
| Compounding | | | | | | | | |
| (A) BAC-45 | 12.5 | 20 | 5 | 37.5 | 12.5 | 12.5 | 12.5 | 12.5 |
| (A) MM-1000-80 | | | | | | | | |
| (A) E-1000-8 | | | | | | | | |
| (B) NK Ester LA | 12.5 | 5 | 20 | 37.5 | 12.5 | 12.5 | 12.5 | 12.5 |
| (B) Light Ester M-3F | | | | | | | | |
| (B) Daiso Dap Monomer | | | | | | | | |
| (C) Percumyl D | 0.5 | 0.5 | 0.5 | 1.5 | 0.1 | 1.75 | 0.5 | 0.5 |
| (E) A-1289 | 0.5 | 0.5 | 0.5 | 2.25 | 0.5 | 0.5 | 0.1 | 1.75 |
| BI-2000 | | | | | | | | |
| (G) Dicyandiamide | | | | | | | | |
| KBM-403E | 0.2 | 0.2 | 0.2 | 0.75 | 0.2 | 0.2 | 0.2 | 0.2 |
| (D) Silver powder | 75.0 | 75.0 | 75.0 | | 75.0 | 75.0 | 75.0 | 75.0 |
| (D) Copper powder | | | | | | | | |
| (D) Crushed silica | | | | 25 | | | | |
| Performances | | | | | | | | |
| Viscosity (Pa · s) | 18.1 | 24.3 | 16.2 | 21.3 | 18.3 | 18 | 18.2 | 17.9 |
| Elastic modulus (MPa) | 3300 | 2900 | 2800 | 3000 | 3100 | 3200 | 3000 | 3100 |
| Adhesion strength (N/6 × 6 mm) | | | | | | | | |
| 30 seconds curing | 60 | 55 | 50 | 58 | 50 | 63 | 62 | 54 |
| 60 seconds curing | 72 | 77 | 70 | 77 | 71 | 78 | 66 | 78 |
| Solder cracking resistance | 0/8 | 0/8 | 0/8 | 0/8 | 0/8 | 0/8 | 0/8 | 0/8 |

| | Examples | | | | | |
|---|---|---|---|---|---|---|
| | 9 | 10 | 11 | 12 | 13 | 14 | 15 |
| Compounding | | | | | | | |
| (A) BAC-45 | | | 12.5 | 12.5 | 12.5 | 12.5 | 12.5 | 12.5 |
| (A) MM-1000-80 | 10 | | | | | | |
| (A) E-1000-8 | 2.5 | | | | | | |
| (B) NK Ester LA | 12.5 | | | 12.5 | | 12.5 | 12.5 | 12.5 |

TABLE 1-continued

|  | | | | | | | |
|---|---|---|---|---|---|---|---|
| (B) Light Ester M-3F |  | 12.5 |  |  |  |  |  |
| (B) Daiso Dap Monomer |  |  | 12.5 |  |  |  |  |
| (C) Percumyl D | 0.5 | 0.5 | 0.5 | 0.5 | 0.5 | 0.5 | 0.5 |
| (E) A-1289 | 0.5 | 0.5 | 0.5 | 0.5 | 0.5 | 0.5 |  |
| BI-2000 |  |  |  |  |  | 2.5 |  |
| (G) Dicyandiamide |  |  |  |  | 0.5 |  |  |
| KBM-403E | 0.2 | 0.2 | 0.2 | 0.2 | 0.2 | 0.2 | 0.2 |
| (D) Silver powder | 75.0 | 75.0 | 75.0 | 75.0 | 75.0 | 75.0 | 75.0 |
| (D) Copper powder |  |  |  | 0.5 |  |  |  |
| (D) Crushed silica |  |  |  |  |  |  |  |
| Performances | | | | | | | |
| Viscosity (Pa · s) | 20.5 | 21.4 | 21.2 | 22.1 | 21.8 | 23.1 | 17.6 |
| Elastic modulus (MPa) | 3800 | 3400 | 3200 | 3500 | 3600 | 2400 | 3200 |
| Adhesion strength (N/6 × 6 mm) | | | | | | | |
| 30 seconds curing | 65 | 67 | 65 | 75 | 82 | 55 | 36 |
| 60 seconds curing | 94 | 87 | 89 | 78 | 90 | 87 | 45 |
| Solder cracking resistance | 0/8 | 0/8 | 0/8 | 0/8 | 0/8 | 0/8 | 1/8 |

TABLE 2

|  | Comparative Examples | | |
|---|---|---|---|
|  | 1 | 2 | 3 |
| Compounding | | | |
| (A) BAC-45 | 25 |  |  |
| (B) NK Ester LA |  | 25 |  |
| (C) Percumyl D | 0.5 | 0.5 |  |
| (E) A-1289 | 0.5 | 0.5 |  |
| KBM-403E | 0.2 | 0.2 | 0.2 |
| (D) Silver powder | 75.0 | 75.0 | 75.0 |
| Bis A epoxy |  |  | 16.0 |
| CGE |  |  | 6.9 |
| PN |  |  | 1.2 |
| Curezole 2PHZ |  |  | 0.7 |
| Performances | | | |
| Viscosity (Pa · s) | 34.5 | 12.3 | 20.8 |
| Elastic modulus (MPa) | 3000 | 970 | 5600 |
| Adhesion strength (N/6 × 6 mm) | | | |
| 30 seconds curing | 20 | 12 | 25 |
| 60 seconds curing | 24 | 23 | 50 |
| Solder cracking resistance | 8/8 | 8/8 | 6/8 |

As clear from Table 1 and Table 2, the die-attaching pastes of the present invention, as compared with those of Comparative Examples, are superior in solder cracking resistance. Therefore, a semiconductor device superior in reliability can be produced by using the die-attaching paste of the present invention.

INDUSTRIAL APPLICABILITY

The die-attaching paste of the present invention can be used as an adhesive for bonding of a semiconductor chip and a lead frame, in the semiconductor industry. By using the present die-attaching paste, it is possible to produce a semiconductor device superior in productivity, cost and properties, etc.

What is claimed is:

1. A die-attaching paste comprising as essential components:
   (A) a hydrocarbon having a number-average molecular weight of 500 to 5,000 and at least one double bond in the molecule, or its derivative, said hydrocarbon or its derivative consisting of
   (A1) a combination of a compound obtained by a reaction between a maleinized polybutadiene and a (meth) acrylic acid/aliphatic dialcohol ester, and an epoxidized polybutadiene,
   (A2) a polybutadiene having acrylic or methacrylic group at the two terminals, or
   (A3) a combination of an acrylic or methacrylic group-containing polybutadiene which is liquid at room temperature and an epoxidized polybutadiene,
   (B) a reactive diluent,
   (C) a radical polymerization catalyst, and
   (D) a filler.

2. A die-attaching paste according to claim 1, wherein the reactive diluent (B) is a compound having at least one acrylic or methacrylic group in the molecule.

3. A die-attaching paste according to claim 1, wherein the reactive diluent (B) is a (meth)acrylic monomer having at least one fluorine atom in the molecule.

4. A die-attaching paste according to claim 1, wherein the reactive diluent (B) is diallyl phthalate.

5. A die-attaching paste according to claim 1, wherein a part of the filler (D) is at least one metal element selected from iron, cobalt, nickel, copper and zinc.

6. A die-attaching paste according to claim 1, further comprising:
   (E) a silane coupling agent represented by the following general formula (1):

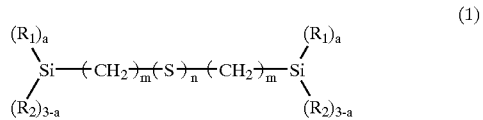

wherein $R_1$ is an alkoxy group having 1 to 10 carbon atoms, $R_2$ is an alkyl group having 1 to 10 carbon atoms, a is an integer of 1 to 3, m is an integer of 1 to 5, and n is an integer of 1 to 10.

7. A die-attaching paste according to claim 1, further comprising:
   (F) a hydrogenated polybutadiene having a number-average molecular weight of 500 to 4,000.

8. A die-attaching paste according to claim 1, further comprising:
   (G) a curing accelerator which is a compound having at least one primary amino group in the molecule and a melting point of 100 to 230° C.

9. A semiconductor device produced by using the die-attaching paste as set forth in claim 1.

* * * * *

UNITED STATES PATENT AND TRADEMARK OFFICE
CERTIFICATE OF CORRECTION

PATENT NO. : 6,861,013 B2
DATED : March 1, 2005
INVENTOR(S) : Tanaka, Nobuki et al.

It is certified that error appears in the above-identified patent and that said Letters Patent is hereby corrected as shown below:

<u>Title page,</u>
Item [30], Foreign Application Priority Data, should read as follows:
-- [30] Foreign Application Priority Data
    April 10, 2000  (JP)  ................... 2000-107637
    Aug. 28, 2000  (JP)  ................... 2000-257734
    Sep. 18, 2000  (JP)  ................... 2000-281109
    Sep. 28, 2000  (JP)  ................... 2000-296899
    Oct. 5, 2000    (JP)  ................... 2000-306227 --

Signed and Sealed this

Twenty-fourth Day of May, 2005

JON W. DUDAS
*Director of the United States Patent and Trademark Office*